US012248627B2

(12) United States Patent
Rink et al.

(10) Patent No.: US 12,248,627 B2
(45) Date of Patent: Mar. 11, 2025

(54) ELECTRONIC MODULE FOR A WEARABLE SENSOR SYSTEM AS WELL AS WEARABLE SENSOR SYSTEM

(71) Applicant: Workaround GmbH, Munich (DE)

(72) Inventors: Thomas Rink, Munich (DE); Matthew Roberts, Munich (DE); Adam Mujaj, Munich (DE); Danijel Juric, Munich (DE); Tobias Spötzl, Munich (DE)

(73) Assignee: Workaround GmbH, Munich (DE)

( * ) Notice: Subject to any disclaimer, the term of this patent is extended or adjusted under 35 U.S.C. 154(b) by 27 days.

(21) Appl. No.: 18/085,387

(22) Filed: Dec. 20, 2022

(65) Prior Publication Data

US 2023/0195227 A1  Jun. 22, 2023

(30) Foreign Application Priority Data

Dec. 21, 2021  (DE) ...................... 10 2021 133 984.7

(51) Int. Cl.
| | |
|---|---|
| *G06K 7/00* | (2006.01) |
| *G06F 3/01* | (2006.01) |
| *G06K 7/10* | (2006.01) |
| *H05K 5/00* | (2006.01) |

(52) U.S. Cl.
CPC .......... *G06F 3/014* (2013.01); *G06K 7/10821* (2013.01); *H05K 5/0008* (2013.01); *H05K 5/0065* (2013.01)

(58) Field of Classification Search
CPC .......... G06F 3/011; G06F 1/163; G06F 3/014; G06F 3/0304; G06F 18/00; G06K 7/10891; G06K 7/1417; G06K 7/10821; H05K 5/0086; H05K 5/0008; H05K 5/0065

USPC .................................................. 235/435, 492
See application file for complete search history.

(56) References Cited

U.S. PATENT DOCUMENTS

| | | | |
|---|---|---|---|
| 5,543,609 A | 8/1996 | Giordano et al. | |
| 7,090,132 B2 | 8/2006 | Havens et al. | |
| 7,837,112 B2 | 11/2010 | An | |
| 11,093,725 B2 | 8/2021 | Mistkawi et al. | |
| 2012/0320503 A1 | 12/2012 | Yturralde et al. | |
| 2014/0249944 A1 | 9/2014 | Hicks et al. | |
| 2017/0264978 A1* | 9/2017 | Leftly | H04Q 9/00 |
| 2017/0338610 A1* | 11/2017 | Brunnbauer | H01R 33/97 |
| 2019/0156085 A1 | 5/2019 | Handshaw et al. | |
| 2020/0144777 A1* | 5/2020 | Chahine | H01R 13/6205 |
| 2020/0245939 A1* | 8/2020 | Sittig | H05K 3/4691 |

(Continued)

FOREIGN PATENT DOCUMENTS

| | | |
|---|---|---|
| CN | 204203984 U | 3/2015 |
| CN | 212647483 U | 3/2021 |

(Continued)

*Primary Examiner* — Daniel St Cyr
(74) *Attorney, Agent, or Firm* — Dilworth IP, LLC

(57) ABSTRACT

An electronic module for a wearable sensor system including a housing, a support frame, a sensor module and an attachment element for the sensor module. The support frame includes several partitions and defines several compartments within the housing, wherein the attachment element is a component part that is separate from the support frame and is attached to the support frame. The sensor module is located in one of the compartments, termed sensor compartment, and is attached to the attachment element. Moreover, a wearable sensor device is shown.

17 Claims, 5 Drawing Sheets

(56) References Cited

U.S. PATENT DOCUMENTS

| | | | | |
|---|---|---|---|---|
| 2020/0267852 A1* | 8/2020 | Brunnbauer | ......... | B65H 75/486 |
| 2021/0278900 A1* | 9/2021 | Kirchner | ............ | G06K 19/0723 |
| 2022/0121284 A1* | 4/2022 | Walsh | ..................... | G06F 3/014 |

FOREIGN PATENT DOCUMENTS

| | | | | |
|---|---|---|---|---|
| DE | 102016109117 | * 11/2017 | ............... | A41D 1/00 |
| JP | 2013088953 A | 5/2013 | | |

\* cited by examiner

ELECTRONIC MODULE FOR A WEARABLE SENSOR SYSTEM AS WELL AS WEARABLE SENSOR SYSTEM

FIELD OF THE DISCLOSURE

The disclosure relates to an electronic module for a wearable sensor system as well as a wearable sensor system.

BACKGROUND

Wearable sensor systems, in which an electronic module comprising a sensor can be fastened to a user's hand, are known.

For example, such sensor systems are used in industrial settings, such as in assembly and in logistics. For this reason, the electronic modules used need to have a long service life and a small overall height to avoid impeding the user during his or her activities.

In addition, a simple assembly of the electronic module is desirable in order to keep the production costs low.

SUMMARY

Thus, there is a need to provide an electronic module as well as a sensor system that in particular are economical and compact as well as have a long service life.

The object is solved by means of an electronic module for a wearable sensor system comprising a housing, a support frame, a sensor module and an attachment element for the sensor module. The support frame comprises several partitions and defines several compartments within the housing. The attachment element is a component part that is separate from the support frame and is attached to the support frame, wherein the sensor module is located in one of the compartments, termed sensor compartment, and is attached to the attachment element.

By using a support frame with various compartments, the various electronic components, in particular the sensor module, can be attached securely in the electronic module and require less space. In addition, the separate attachment element for the sensor module simplifies the assembly.

In particular, the support frame and the housing are separate component parts. More particularly, the support frame does not form a part of the housing.

It is also conceivable that various sensor modules can be built into the same support frame by means of various attachment elements, thereby providing a modular system.

In particular, the sensor module is attached solely to the attachment element, wherein resting on is not an attachment within the meaning of the disclosure.

The sensor compartment is located, for example, on the front side of the electronic module and/or is open towards the front or is provided with a window.

The partitions can extend vertically or horizontally.

To improve the service life, the attachment element can be screwed onto the support frame and/or the sensor module can be screwed onto the attachment element.

For example, the support frame is located within the housing, in particular completely enclosed by the housing, wherein the compartments are also delimited by the housing, thereby reducing the number of partitions required.

The compartments are delimited here by the partitions and parts of the housing.

In particular, the compartments are only connected to each other by cable penetrations.

In an embodiment, the sensor compartment comprises a support strut for the sensor module in order to protect the sensor module from moving undesirably.

In an embodiment, the sensor module is a barcode scanner to enable the sensor module to be used in potential applications versatilely.

Within the scope of the disclosure, a barcode scanner is understood to mean a module with a camera that is configured to read machine-readable codes, in particular barcodes, matrix codes, QR codes or similar codes.

For example, the attachment element is made of metal and/or the support frame is made of plastic, thereby making the attachment element extremely stable and ensuring the support frame is designed flexibly.

To ensure simple assembly, the attachment element can be a plate or have a U-shaped cross section, in particular wherein the attachment element is attached on the upper side of the corresponding partitions to the support frame.

For example, the attachment element comprises several holes for screwing on the sensor module.

In an embodiment, the housing comprises an upper part, in particular a housing shell, and a lower part, in particular a base plate. Here, the support frame can be attached to the lower part and/or the upper part is attached to the lower part, thereby providing in each case a stable, but easy to assemble connection. The connection occurs, for example, by being screwed together or is a snap-fit connection.

To simplify the assembly further, the electronic module can comprise in addition to the sensor module at least one further electronic component that is located in a compartment different from the sensor compartment, in particular wherein the electronic module comprises several further electronic components that are each located in a separate compartment that is different from the sensor compartment.

In an embodiment, said at least one further electronic component is an accumulator, a mainboard, a further sensor and/or an output device, thereby enabling the electronic module to be equipped with different capabilities.

Within the scope of this disclosure, a mainboard is understood to mean, for example, a system on a chip (SoC).

A further sensor is, for example, an acceleration sensor. The output device can be a screen, a vibration motor and/or a speaker.

In an embodiment, at least a mainboard and an accumulator are provided as further electronic components, wherein the compartments, in which the mainboard and the accumulator are located, termed mainboard compartment and accumulator compartment, respectively, adjoin each other and are delimited by a horizontal partition, in particular wherein the heights of the mainboard compartment, the accumulator compartment and the intermediate partition together equal the height of the sensor compartment. Thus, the accumulator and the mainboard can be stowed away securely in a manner that saves space.

In particular, the heights of the mainboard compartment, the accumulator compartment and the intermediate partition or the height of the sensor compartment equal the height of the volume delimited by the housing.

For a particularly compact configuration, the mainboard compartment and the accumulator compartment can adjoin the sensor compartment.

For example, the accumulator compartment can be separated from the sensor compartment by a vertical partition. The sensor compartment is located, in particular, in front of the accumulator compartment and the mainboard compartment.

To provide the user with feedback or instructions, at least one output device can be provided as a further electronic component, wherein the compartment, in which the output device is located, adjoins the sensor compartment, in particular laterally.

In an embodiment, the electronic module comprises several electrical contact elements on its underside that are contactable from outside the housing, in particular which extend through the housing. By this means, the electronic module can be integrated into the rest of sensor system simply.

For example, the contact elements extend through the underside of the housing and/or are connected to the mainboard electrically.

Moreover, the object is solved by means of a wearable sensor system comprising a garment and an electronic module as previously described. The garment comprises a glove and a holder attached to the glove for attaching the electronic module to the glove repeatably without using tools.

The features and advantages described for the electronic module apply equally to the sensor system and vice versa.

In particular, the holder is permanently fixed to the glove.

In an embodiment, the holder comprises at least one mating contact that contacts said at least one electrical contact element of the electronic module electrically when the electronic module is inserted into the holder, wherein the garment comprises a functional component, in particular a trigger, that is attached at least to and/or in the glove and is connected to the mating contact electrically. In this way, the electronic module can be actuated particularly simply.

BRIEF DESCRIPTION OF THE DRAWINGS

Additional features and advantages of the disclosure are found in the following description as well as the attached drawings to which reference is made. In the drawings.

DETAILED DESCRIPTION

Lists having a plurality of alternatives connected by "and/or", for example "A, B and/or C" are to be understood to disclose an arbitrary combination of the alternatives, i.e., the lists are to be read as "A and/or B and/or C" or as "at least one of A, B or C". The same holds true for listings with more than three items.

Figure 1:
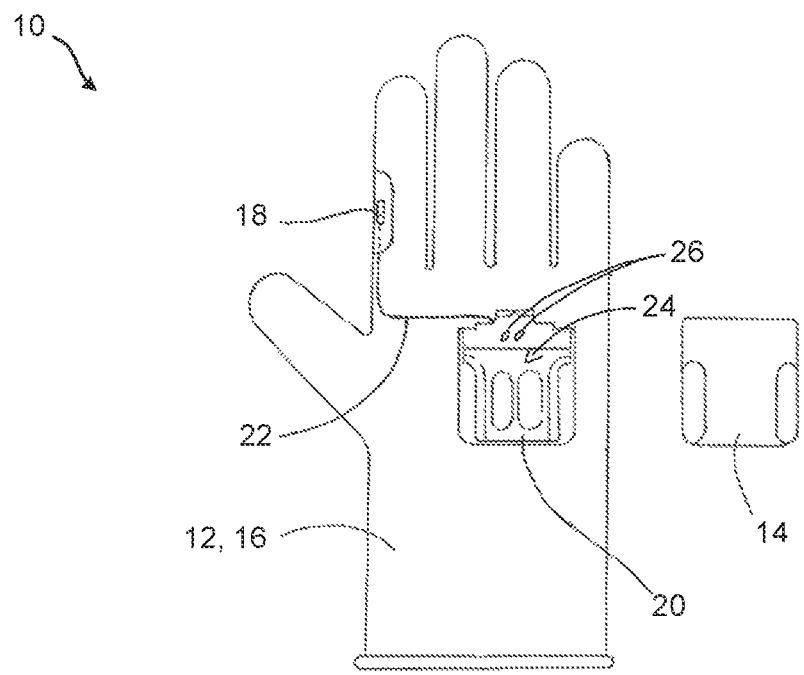
FIG. 1 shows a sensor system according to an embodiment of the disclosure comprising an electronic module according to an embodiment of the disclosure.

In FIG. 1, a wearable sensor system 10 is shown comprising a glove 12 and an electronic module 14.

The garment 12 comprises a glove 16, a functional component 18, for example a push button, a holder 20 and a cable 22.

Figure 9:
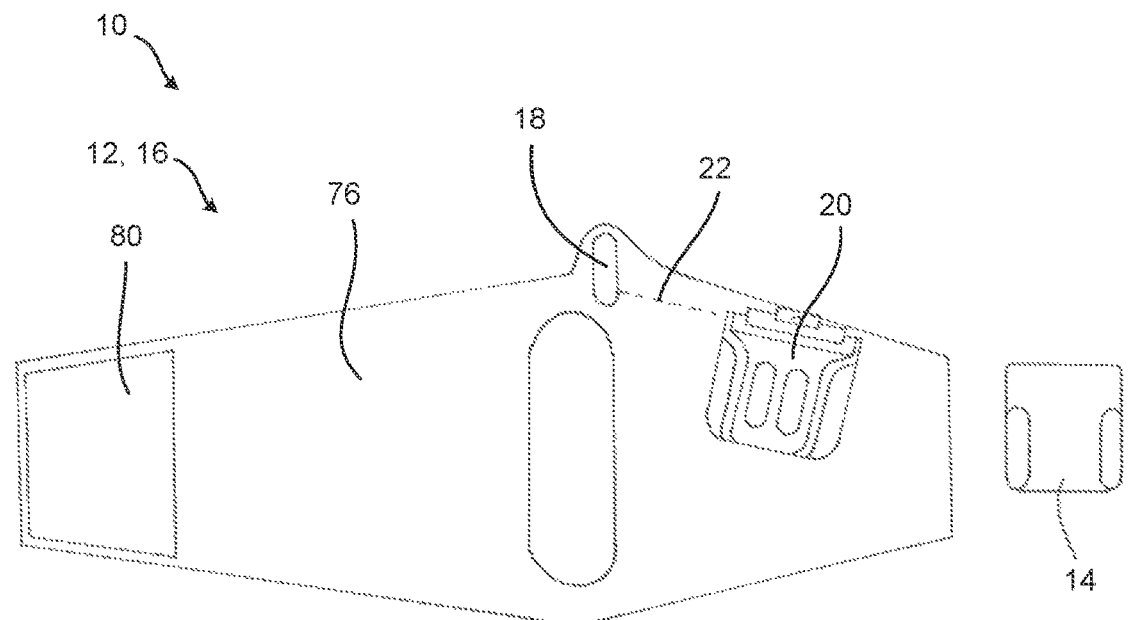
FIG. 9 shows a wearable sensor system according to an embodiment of the disclosure comprising a garment according to a further embodiment of the disclosure.

The glove 16 can be configured, as shown in FIG. 1, as a full glove or as another hand garment, such as a finger stall, a covering or a bandage with a band-like base body (FIG. 9).

The holder 20 is permanently fixed to the glove 16 and comprises a receiving space 24 for the electronic module 14 and mating contacts 26 that are connected to the functional component 18 via the cable 22. In the shown embodiment, two mating contacts 26 are provided.

The functional component 18 can be a trigger, such as a push button, that when actuated, for example, shorts the mating contacts 26 or insulates them from each other.

For example, the glove is an elastic and close-fitting work glove that meets occupational safety requirements e.g., for assembly work.

Figure 2:
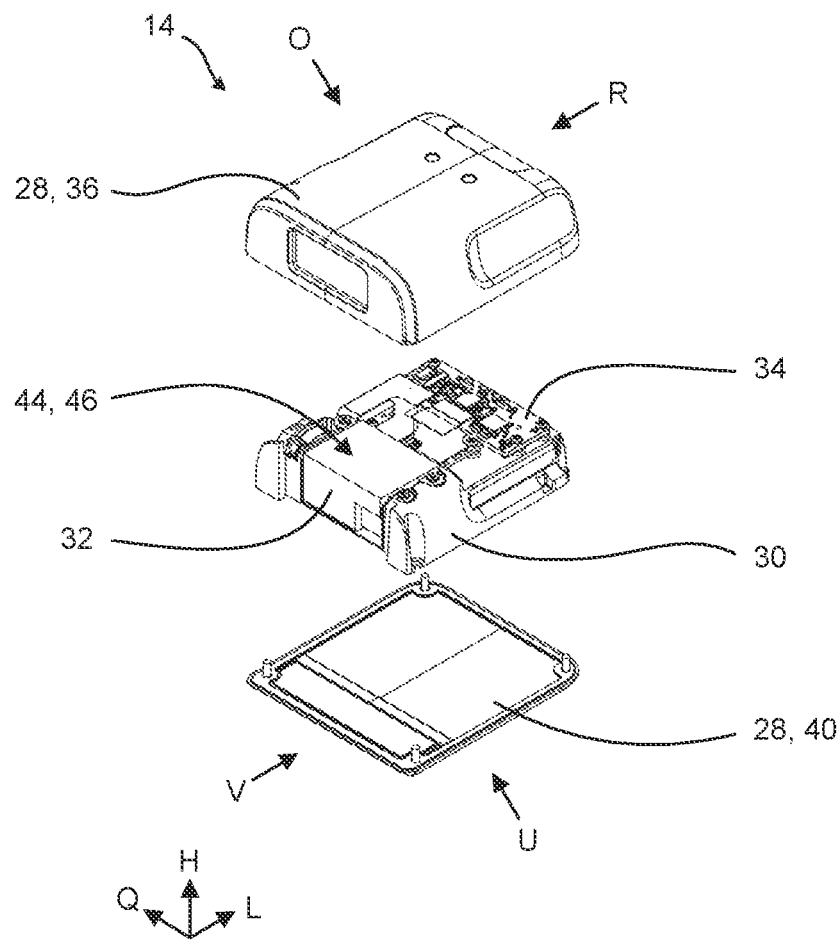
FIG. 2 shows the electronic module according to FIG. 1 in a simplified exploded view.

The electronic module 14 is configured complementary to the receiving space 24, as can also be seen in FIG. 2, so that the electronic module 14 can be attached repeatably without using tools as well as removed again from the receiving space 24.

The electronic module 14 comprises a housing 28, a support frame 30, a sensor module 32 as well as a mainboard 34.

The sensor module 32 is, for example, a barcode scanner, i.e., a module with a camera that is configured to read machine-readable codes. For example, barcodes, matrix codes, QR codes and the like can be read using the sensor module 32.

The mainboard 34 is, for example, a system on a chip ("SoC"). However, other printed circuit boards are also conceivable, by means of which the signals of the sensor module 32 are received and are forwarded to a receiver, in particular wirelessly.

The housing 28 comprises an upper part 36, in the shown embodiment a housing shell, and a lower part 40, in the shown embodiment a base plate.

The upper part 36 of the housing 28 is attached to the lower part 40, for example by means of snap-fit connections. It is also conceivable that the upper part 36 and the lower part 40 are screwed together.

The housing 28 thus delimits a volume within which the support frame 30 is located.

The housing 28 and the support frame 30 have a front side V, rear side R, an underside U and an upper side O as well as a longitudinal direction L that extends from the front side V to the rear side R, a transverse direction Q that is transverse to the longitudinal direction L and a vertical direction H.

The support frame 30 supports the sensor module 32, the mainboard 34 and, if applicable, further electronic components 64.

The support frame 30 is attached to the lower part 40, in particular screwed on. For example, no direct attachment exists between the support frame and the upper part 36.

The support frame 30 and the housing 28, i.e., the lower part 40 and the upper part 36, are separate component parts. More particularly, the support frame 30 does not form a part of the lower part 40 or of the upper part 36 of the housing 28.

Figure 3:
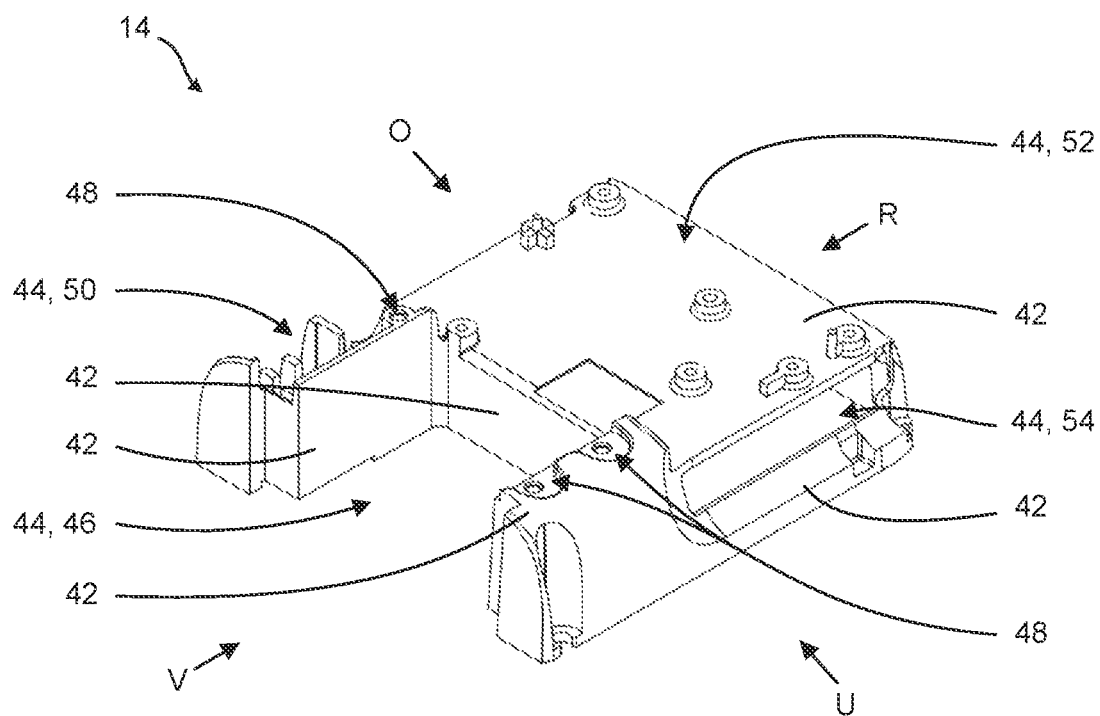
FIGS. 3-4 show a support frame of the electronic module according to FIG. 1 in a perspective view from above and below respectively.
Figure 4:
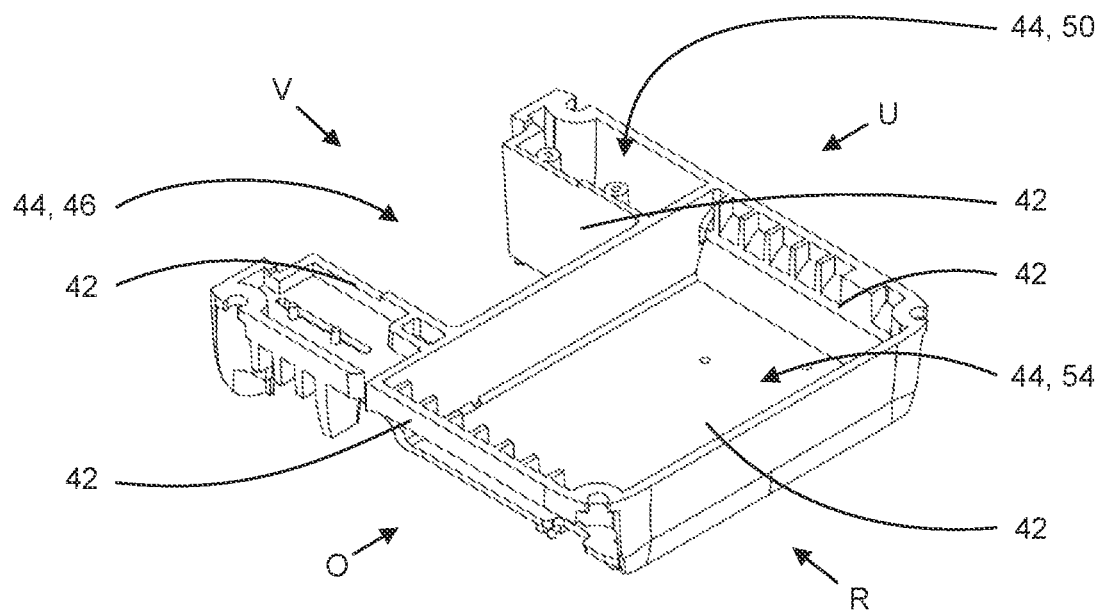

FIGS. 3 and 4 show the support frame 30 alone in detail in perspective views from above and below respectively.

The support frame 30 is, for example, made of plastic and/or is a single piece. In particular, the support frame 30 is an injection-moulded part or is manufactured using additive manufacturing.

The support frame 30 comprises several partitions 42 that at least partially delimits the different compartments 44 of the support frame 30 and ultimately compartments 44 within the volume delimited by the housing 28, thus defining them.

The partitions 42 can extend both vertically and in the longitudinal direction L of the support frame 30, vertically and in the transverse direction Q of the support frame 30 or horizontally in the longitudinal and transverse directions L, Q.

For example, the support frame 30 comprises a first compartment 44 for the sensor module, which is termed the sensor compartment 46.

The support frame 30 is open at the sensor compartment 46 to the front side V. Similarly, the support frame 30 does not comprise a delimitation for the sensor compartment 46 to the upper side O and to the underside U so that the sensor compartment 46 is delimited upwards and downwards by the housing 28.

In the transverse direction Q, the sensor compartment 46 is delimited by two vertical partitions 42 and to the rear side R by a further vertical partition 42 that extends in the transverse direction Q.

Attachment means 48, here in the form of holes, in particular threaded holes, are provided on the upper side of the partitions 42 that delimit the sensor compartment 46 in the transverse direction Q. These attachment means 48 can however be provided as a push-in connector or a snap-fit connector.

The height of the sensor compartment 46 in the vertical direction H is equal to the height of the volume delimited by the housing 28.

A second compartment 50 is located laterally adjacent to the sensor compartment 46. The second compartment 50 is delimited towards the front side V by a vertical partition 42 running in the transverse direction Q and separated from the sensor compartment 46 by one of the vertical partitions 42 running in the longitudinal direction L.

Two further compartments 44 are located from the sensor compartment 46 towards the rear side R, hereinafter termed the mainboard compartment 52 and the accumulator compartment 54.

The mainboard compartment 52 and the accumulator compartment 54 are adjacent to the sensor compartment 46.

The partition 42 that delimits the sensor compartment 46 to the rear also delimits the accumulator compartment 54 to the front side V. The accumulator compartment 54 is also delimited to the rear side R by a vertical partition 42 running in the transverse direction Q.

In the transverse direction Q, the accumulator compartment 54 is delimited by vertical partitions 42 running in the longitudinal direction L.

The support frame 30 is open in the region of the accumulator compartment 54 towards the underside U so that the accumulator compartment 54 is delimited downwards by the housing 28, more specifically the lower part 40.

Towards the upper side, the accumulator compartment 54 is delimited by a horizontal partition 42 running in the longitudinal direction L and transverse direction Q.

This partition 42 simultaneously forms the lower delimitation of the mainboard compartment 52.

The partition 42 running horizontally comprises an opening for the cable routing between the mainboard compartment 52 and the accumulator compartment 54.

The mainboard compartment 52 is open to the front to both the sensor compartment 46 and the second compartment 50.

In the transverse direction Q and to the rear side R, the mainboard compartment 52 is delimited by the housing 28, for example the upper part 36.

A connection between the sensor compartment 46 and the accumulator compartment 54 is not provided.

The heights of the accumulator compartment 54, the mainboard compartment 52 as well as the thickness of the horizontal partition 42 between the mainboard compartment 52 and the accumulator compartment 54 also equal together the height of the volume delimited by the housing 28.

The sensor compartment 46 thus has a height equal to the height of the mainboard compartment 52 plus the height of the accumulator compartment 54 plus the thickness of the horizontal partition 42 between the mainboard compartment 52 and the accumulator compartment 54.

Figure 5:
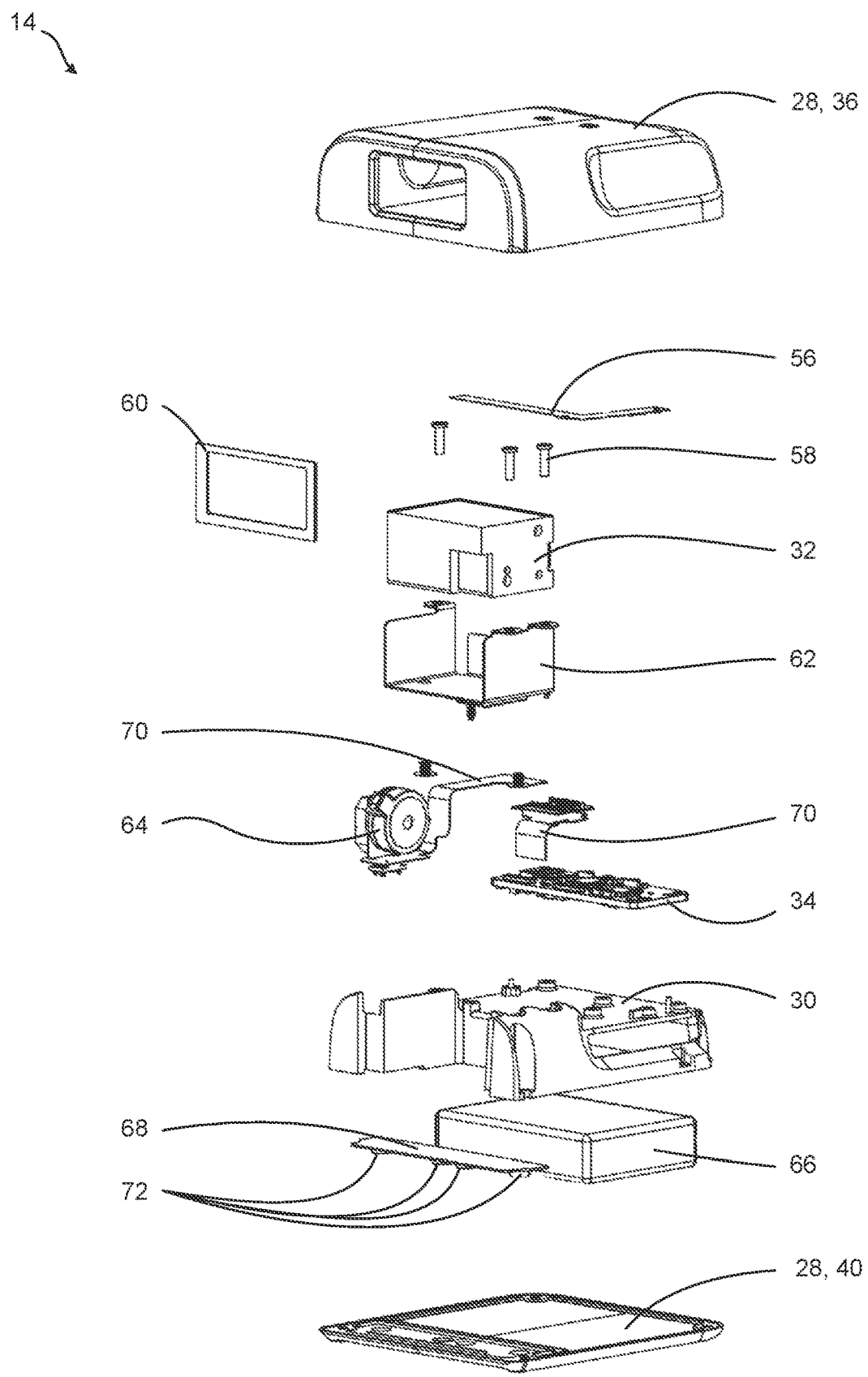
FIG. 5 shows the electronic module according to FIG. 1 in a detailed exploded view.

In FIG. 5, the electronic module 14 is shown in a detailed exploded view.

As can be seen, the electronic module 14 also comprises an antenna 56, several screws 58, a pane 60, an attachment element 62, a further electronic component 64, an accumulator 66, a contact strip 68 as well as several cables 70.

The pane 60 is, for example a real glass pane or a plastic pane that is inserted in the corresponding opening on the upper part 36 of the housing 28 and is delimited to the front by the sensor compartment 46.

Through the pane 60, the sensor module 32 can capture objects and codes in front the electronic module 14.

The sensor module 32 is attached to the sensor compartment 46 by means of the attachment element 62.

The attachment element 62 is a component separate from the support frame 30. For example, the attachment element 62 is made of metal, in particular produced from a metal plate.

In the shown embodiment, the attachment element 62 has a U-shaped cross section with two arms and a base, wherein the arms run along the lateral partitions 42 of the sensor compartment 46.

Attachment means are provided on the top ends of the arms, here in the form of a flange with through holes that correspond to the attachment means 48 on the partitions 42 of the support frame 30.

By means of screws 58, which extend through the through holes and into the attachment means 48, the attachment element 62 is attached to the support frame 30 in the sensor compartment 46.

The sensor module 32 is attached to the attachment element 62, in particular on the base.

To this end, the attachment element 62 comprises at least one hole in the base, through said hole at least one screw is guided in order to attach the sensor module 32 to the attachment element 62.

In particular, the sensor module 32 fits exactly into the attachment element 62, i.e., within the U-shaped cross section. The attachment element 62 fits in turn exactly into the sensor compartment 46.

The sensor module 32 is thus connected to the attachment element 62, in particular screwed on. The attachment element 62 is attached in turn to the support frame 30, in particular screwed on.

Thus, the sensor module 32 is attached solely to the attachment element 62. Within the scope of this disclosure, the word 'attach' is understood to mean a permanent attachment and not just being placed on.

The further electronic component 64 is, for example, an acceleration sensor and/or an output device, such as a vibration motor.

It is also conceivable that the further electronic component 64 is an output device such as a screen or a speaker.

The further electronic component 64, thus here the vibration motor, is located in the second compartment 50 and attached there.

The mainboard 34 is located in the mainboard compartment 52 and connected there to the support frame 30. In particular, the mainboard 34 is screwed to the horizontal partition 42 on the underside of the mainboard compartment 52.

Similarly, the antenna 56 is provided in the mainboard compartment 52 and is connected to the mainboard 34 electrically.

The accumulator 66 is located in the accumulator compartment 54. For example, the accumulator 66 is inserted from the underside into the support frame 30 and is held by the lower part 40 of the housing 28. In particular, the accumulator 66 fits exactly into the accumulator compartment 54.

Thus, each of the electronic components, i.e., the sensor module 32, the mainboard 34, the accumulator 66 or the further electronic component 64, is located in a separate compartment 44 within the housing 28.

The electronic components are connected to each other by means of the cable 70. In this way, the secure attachment of all components is ensured while simultaneously ensuring a reliable electrical connection.

The contact strip 68 is provided within the housing 28 on the lower part 40 and comprises a base body as well as electrical contact elements 72 extending therefrom. The electrical contact elements 72 are connected to the mainboard 34 electrically.

The electrical contact elements 72 extend along the underside U of the electronic module 14 and, for example, through the lower part 40 of the housing 28.

The contact elements 72 are thus contactable from outside of the housing 28. If the electronic module 14 is inserted into the receiving space 24, the contact elements 72 of the electronic module 14 physically contact the mating contacts 26 of the holder 20.

In this way, an electronic module 14 is provided that is simple and reliable to assemble as a separate compartment 44 is provided for each electronic compartment. At the same time, the compartments 44 result in the corresponding electronic component being attached securely and robustly, thereby increasing the service life of the electronic module 14.

Moreover, the stability can be increased by the support frame 30 and the electronic module 14 can thus be configured with a lower height.

Figure 6:
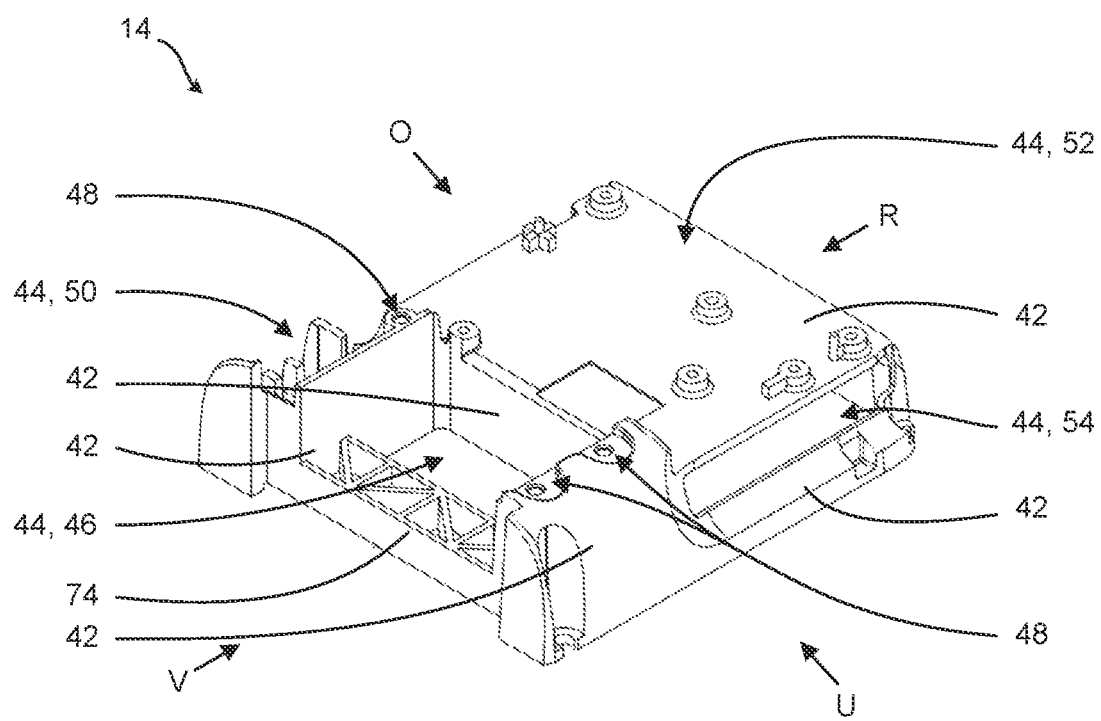
FIGS. 6-7 show a support frame of an electronic module according to a second embodiment in a perspective view from above and below respectively.
Figure 7:
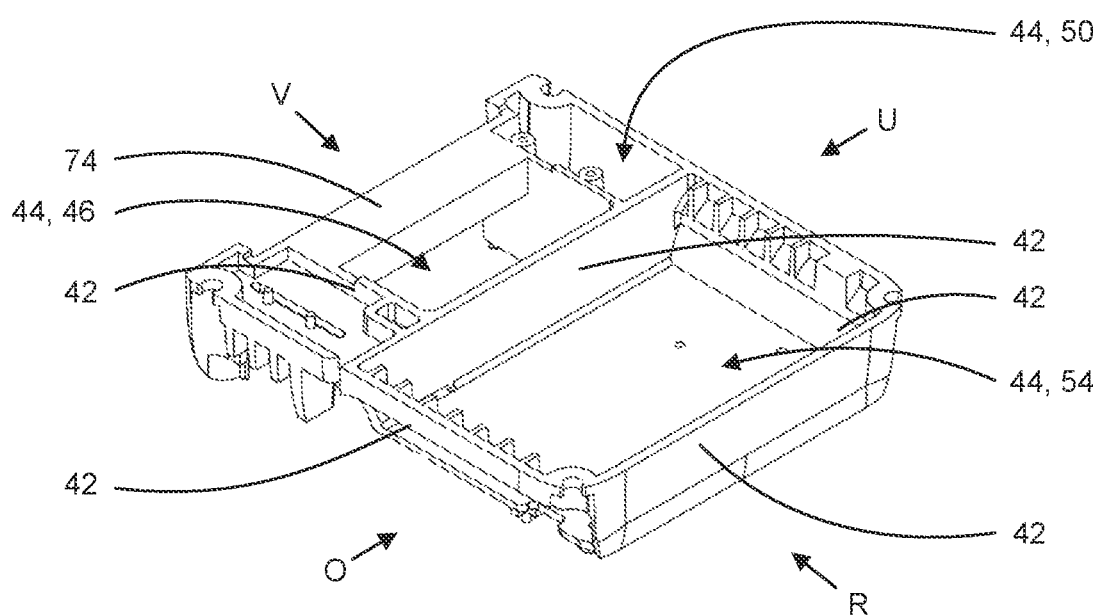
Figure 8:
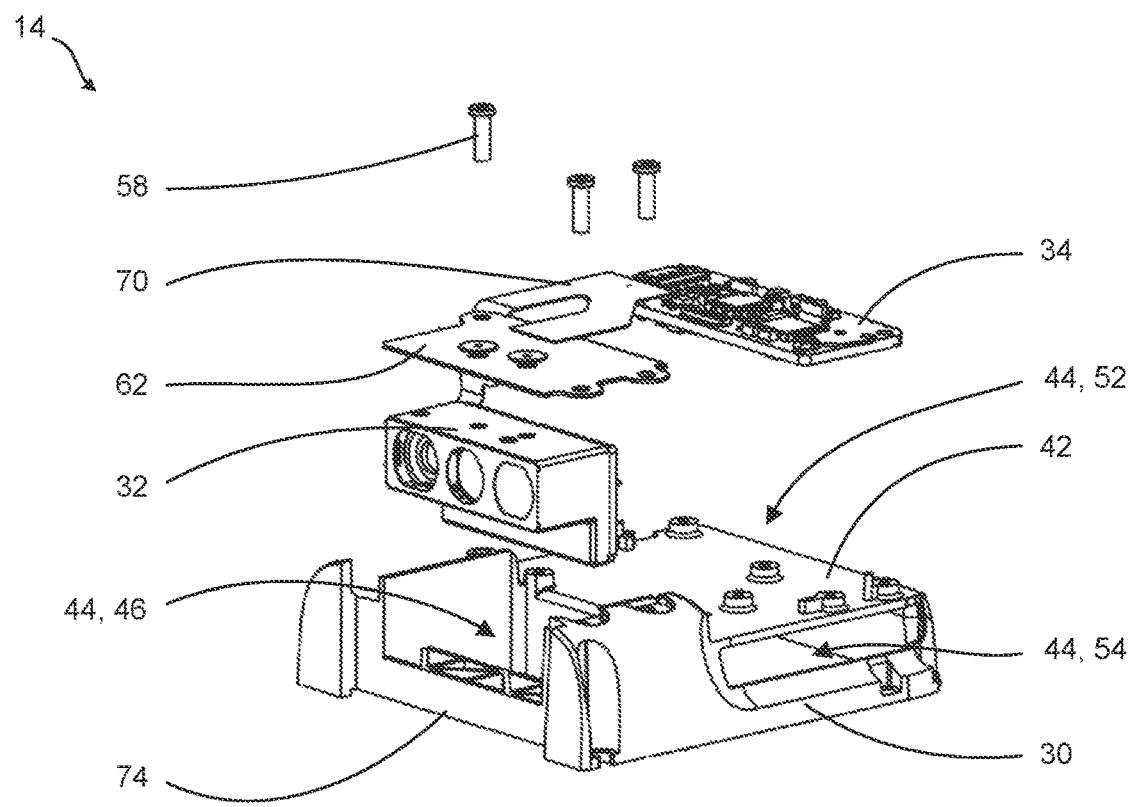
FIG. 8 shows a simplified exploded view of the electronic module according to the embodiment of FIGS. 6 and 7.

FIGS. 6 to 8 show a second embodiment of the electronic module 14 is shown which substantially corresponds to that of the first embodiment. Therefore, only the differences are discussed hereinafter and the same parts and parts with the same function are provided with the same reference signs.

FIGS. 6 and 7 correspond to the views of FIGS. 3 and 4. They show the support frame 30 of the electronic module 14 according to the second embodiment in a perspective view from above and below respectively.

It is clearly evident that, in contrast to the first embodiment, a support strut 74 is provided within the sensor compartment 46. The support strut 74 extends in the transverse direction Q on the front side of the sensor compartment 46.

Otherwise, the support frame 30 is unchanged in design. In particular, the attachment means 48 on the upper side O of the partitions 42 of the sensor compartment 46 are identical.

In FIG. 8, an exploded view of the parts of the electronic module 14 is shown. For simplification, only the sensor module 32, the attachment element 62, the mainboard 34 and the support frame 30 are shown.

In contrast to the first embodiment, the attachment element 62 is designed as a plate. In addition to the attachment means 48 for attaching the support frame 30, the plate comprises further attachment means for attaching the sensor module 32.

In particular, the attachment element 62 comprises further holes to attach, in particular to screw, the sensor module 32 to the attachment element 62 from the upper side.

By means of the plate as attachment element 62, it is possible to attach the sensor module 32 to the support frame 30 that is to be screwed together from the upper side. In contrast, using the U-shaped attachment element 62, such sensor modules 32 are attached in the support frame 30 which comprises attachment holes on its underside.

Thus, both the plate and the U-shaped attachment element 62 can be attached to each support frame 30 of both embodiments. Thus, a modular system has been created.

In the second embodiment, the sensor module 32 also comprises a recess at its front lower edge. Complementary to this, the support strut 74 is provided so that the sensor module 32 rests on the support strut 74 and is thus supported. An attachment of the sensor module 32 to the support strut 74 is not provided. Nevertheless, the support strut 74 increases the service life of the electronic module 14.

In FIG. 9, the sensor system 10 is shown in a further embodiment, in which the garment 12 is not designed as a full glove. Instead, the garment 12 or rather the glove 16 comprises a band-like base body 76 that can be closed around the user's hand, e.g., by means of a hook-and-loop fastener 78.

In the same way, as described for FIG. 1, the functional component 18, the holder 20 for the electronic module 14 as well as a corresponding cable 22 are provided on the band-like base body 76, i.e., on the glove 16.

The invention claimed is:

1. An electronic module for a wearable sensor system, comprising:
   a housing;
   a support frame;
   a sensor module;
   an attachment element for the sensor module; and
   a mainboard separate from the support frame; and
   an accumulator,
   wherein the support frame comprises several partitions that define several compartments within the housing,
   wherein the attachment element is a component part that is separate from the support frame and is attached to the support frame,
   wherein the sensor module is located in one of the compartments, termed a sensor compartment, and is attached to the attachment element,
   wherein two of the several compartments, in which the mainboard and the accumulator are located, termed mainboard compartment and accumulator compartment, respectively, are different from the sensor compartment, adjoin each other, and are delimited by a horizontal partition.

2. The electronic module according to claim 1, wherein at least one of the attachment element is screwed onto the support frame or the sensor module is screwed onto the attachment element.

3. The electronic module according to claim 1, wherein the support frame is located within the housing, wherein the compartments are also delimited by the housing.

4. The electronic module according to claim 1, wherein the sensor compartment comprises a support strut for the sensor module.

5. The electronic module according to claim 1, wherein the sensor module is a barcode scanner.

6. The electronic module according to claim 1, wherein at least one of the attachment element is made of metal or the support frame is made of plastic.

7. The electronic module according to claim 1, wherein the attachment element is a plate or has a U-shaped cross section.

8. The electronic module according to claim 1, wherein the attachment element is attached to the support frame on an upper side of the partitions.

9. The electronic module according to claim 1, wherein the housing comprises an upper part and a lower part.

10. The electronic module according to claim 9, wherein at least one of the support frame or the upper part is attached to the lower part.

11. The electronic module according to claim 1, further comprising at least one of a further sensor or an output device.

12. The electronic module according to claim 1, wherein heights of the mainboard compartment, the accumulator compartment, and an intermediate partition equal together a height of the sensor compartment.

13. The electronic module according to claim 1, wherein at least one of the mainboard compartment or the accumulator compartment adjoin the sensor compartment.

14. The electronic module according to claim 1, wherein at least an output device is provided as a further electronic component, wherein the compartment, in which the output device is located, adjoins the sensor compartment.

15. The electronic module according to claim 1, wherein the electronic module comprises several electrical contact elements on its underside which are contactable from outside the housing.

16. A wearable sensor system comprising a garment and an electronic module,
wherein the electronic module comprises a housing, a support frame, a sensor module, an attachment element for the sensor module, and a mainboard separate from the support frame, and an accumulator, wherein the support frame comprises several partitions that define several compartments within the housing, wherein the attachment element is a component part that is separate from the support frame and is attached to the support frame, wherein the sensor module is located in one of the compartments, termed the sensor compartment, and is attached to the attachment element, and wherein two of the several compartments, in which the mainboard and the accumulator are located, termed mainboard compartment and accumulator compartment, respectively, are different from the sensor compartment, adjoin each other, and are delimited by a horizontal partition; and
wherein the garment comprises a glove and a holder attached to the glove for attaching the electronic module to the glove repeatably without using tools.

17. The wearable sensor system according to claim 16, wherein the holder comprises at least one mating contact that contacts at least one electrical contact element of the electronic module electrically when the electronic module is inserted into the holder, wherein the garment comprises a functional component that is at least one of attached to the glove or attached in the glove and is connected to the mating contact electrically.

* * * * *